(12) United States Patent
Kazama

(10) Patent No.: US 6,174,172 B1
(45) Date of Patent: *Jan. 16, 2001

(54) ELECTRIC CONTACT UNIT

(75) Inventor: Toshio Kazama, Nagano (JP)

(73) Assignee: NHK Spring Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/091,927

(22) PCT Filed: Dec. 25, 1996

(86) PCT No.: PCT/JP96/03791

§ 371 Date: Jun. 24, 1998

§ 102(e) Date: Jun. 24, 1998

(87) PCT Pub. No.: WO97/24785

PCT Pub. Date: Jul. 10, 1997

(30) Foreign Application Priority Data

Dec. 28, 1995 (JP) .................................. 7-352974

(51) Int. Cl.⁷ .................................................. H01R 12/00
(52) U.S. Cl. .................................................. 439/66; 439/83
(58) Field of Search ........................ 439/66; 6/83; 639/91

(56) References Cited

U.S. PATENT DOCUMENTS

| | | | |
|---|---|---|---|
| 3,258,736 | * 6/1966 | Crawford et al. | 439/65 |
| 3,509,270 | * 4/1970 | Dube et al. | 174/266 |
| 3,616,532 | * 11/1971 | Beck | 439/83 |
| 3,795,884 | * 3/1974 | Kotaka | 439/66 |
| 4,029,375 | * 6/1977 | Gabrielian | 439/66 |
| 4,620,761 | * 11/1986 | Smith et al. | 439/66 |
| 4,705,205 | * 11/1987 | Allen et al. | 439/91 |
| 4,922,376 | * 5/1990 | Pommer et al. | 361/386 |
| 4,961,709 | * 10/1990 | Noschese | 439/66 |
| 5,101,553 | * 4/1992 | Carey | 439/91 |
| 5,427,535 | * 6/1995 | Sinclair | 439/66 |
| 5,540,593 | * 7/1996 | Takahashi | 439/66 |
| 5,791,914 | * 8/1998 | Loranger et al. | 439/66 |

OTHER PUBLICATIONS

IBM Technical Disclousre Bulletin, vol. 22, No. 1, p. 158, Jun. 1979.*

* cited by examiner

Primary Examiner—T. C. Patel
(74) Attorney, Agent, or Firm—Skjerven Morrill MacPherson LLP; Chistopher B. Allenby

(57) ABSTRACT

The electric contact unit 1 according to the present invention comprises an insulating base board 2 incorporated with resilient coil-shaped electroconductive members 3. Each of the coil-shaped electroconductive members 3 may include a small number of turns, for instance a single turn, of coil wire, and comprises an intermediate part secured to the base board 2 and a pair of axial projecting parts projecting from either side of the base board. The base board 2 is secured relative to a semiconductor device 4 and a circuit board 6 in such a manner that the two ends of each coil-shaped electroconductive member resiliently engage an electroconductive ball 5 serving as a terminal fixedly secured to a lower surface of the semiconductor device 4 by soldering, and a terminal pattern 7 formed on the circuit board 6 disposed opposite to the ball. Because the number of turns of the coil-shaped electroconductive member can be reduced as desired so that electric current is not required to be passed through a path involving an undesirably large number of turns, the electric inductance and resistance of the electroconductive member can be thereby minimized while ensuring a sufficient resiliency to the electroconductive member.

48 Claims, 20 Drawing Sheets

(a)

(b)

(c)

(a)

(b)

(a)

(b)

(a)

(b)

(a)

(b)

(a)

(b)

(a)

(b)

(a)

(b)

(a)

(b)

(a)

(b)

US 6,174,172 B1

ELECTRIC CONTACT UNIT

TECHNICAL FIELD

The present invention relates to an electric contact unit which may be used as contact probes for testing semiconductor devices, sockets for semiconductor devices and electric connectors.

BACKGROUND OF THE INVENTION

Conventionally, electric contact units having moveable contact members projecting from both sides of an insulating base board have been proposed for use as contact probe units for electrically testing electroconductive patterns of printed circuit boards and electronic component parts, sockets for semiconductor devices and electric connectors. In a typical contact probe unit employing such moveable contact members, a compression coil spring is coaxially received in each of a plurality of holders to urge a pair of contact needle members away from each other at the two opposite axial ends of the holder. The associated ends of the contact needle members and the compression coil spring are typically connected one another by soldering. Thus, an electric signal received by one of the contact needle members is transmitted to the other contact needle member via the compression coil spring.

However, when the electric signal passed through the contact probe unit is in high frequency ranges (for instance from 10 MHz to several GHz), some ill effects may be produced because the electric current is conducted by the coil-shaped electroconductive member. More specifically, when a high frequency signal is conducted through a coil-shaped electroconductive member, an inductive load is produced. Also, the resulting extended electroconductive path produces a resistive load to the detected signal.

In view of such problems of the prior art, the primary object of the present invention is to provide an electric contact unit which is low in both inductance and resistance.

BRIEF SUMMARY OF THE INVENTION

To achieve such an object, the present invention provides an electric contact unit for conducting electric current between a pair of mutually opposing parts to be contacted, comprising: a base board having a plurality of through holes passed therethrough; a plurality of coil-shaped resilient and electroconductive members passed through corresponding ones of the through holes; and insulating means for electrically insulating the coil-shaped electroconductive members from one another; each of the coil-shaped electroconductive members including an intermediate part fixedly secured in the corresponding through hole, and a pair of axially projecting parts projecting from either side of the base board.

Thus, each of the electroconductive member may consist solely of an electroconductive compression coil spring member, and the length of the electroconductive path can be minimized. As a result, the electric inductance and resistance can be minimized. When this electric contact unit is applied to a socket for a semiconductor device, the height of the socket can be minimized.

According to a preferred embodiment of the present invention, each of the parts of the coil-shaped electroconductive members includes no more than approximately one turn.

The inductance of the electroconductive member increases with the increase in the number of turns thereof. Therefore, by minimizing the number of turns of the electroconductive member while maintaining a required spring property thereof, it is possible to achieve both a desired high frequency property and a satisfactory spring property.

According to another preferred embodiment of the present invention, each of the coil-shaped electroconductive members includes no more than approximately one turn. According to this embodiment, a highly desired high frequency property can be obtained.

According to another aspect of the present invention, the intermediate part of each of the coil-shaped electroconductive members is insert molded in the insulating base board. Alternatively, each of the through holes consists of an electroconductive through hole, and the intermediate part of each of the coil-shaped electroconductive members is soldered or brazed to the corresponding through hole.

When a high contact pressure is desired, at least one of the axially projecting parts of the coil-shaped electroconductive members may comprise a wire end which extends at a certain angle away from a major surface of the base board. When the contact pressure is desired to be minimized, at least one of the axially projecting parts of the coil-shaped electroconductive members comprises a wire end which extends at a certain angle toward a major surface of the base board, or at least one of the axially projecting parts of the coil-shaped electroconductive members comprises a wire end which extends substantially in parallel with a major surface of the base board.

These and other features and advantages will become apparent from the following description with reference to the appended drawings.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
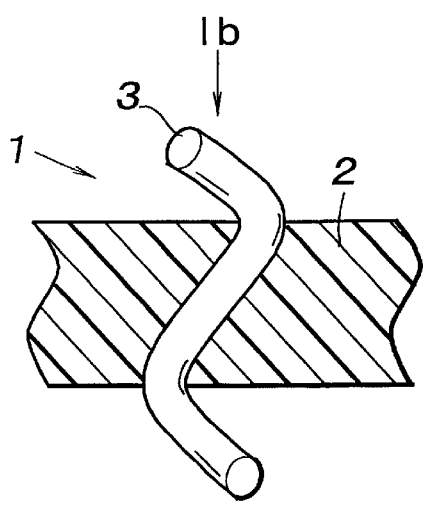
FIG. 1(a) is an enlarged sectional side view of an essential part of a socket for a semiconductor device to which the present invention is applied.
FIG. 1(b) is a plan view as seen from arrow Ia of FIG. 1(a)
FIG. 1(c) is an enlarged sectional side view essentially showing the mode of use of the socket for a semiconductor device shown in FIG. 1.
Figure 1:
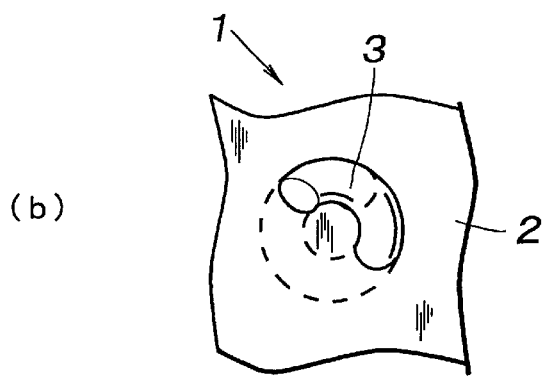
Figure 1:
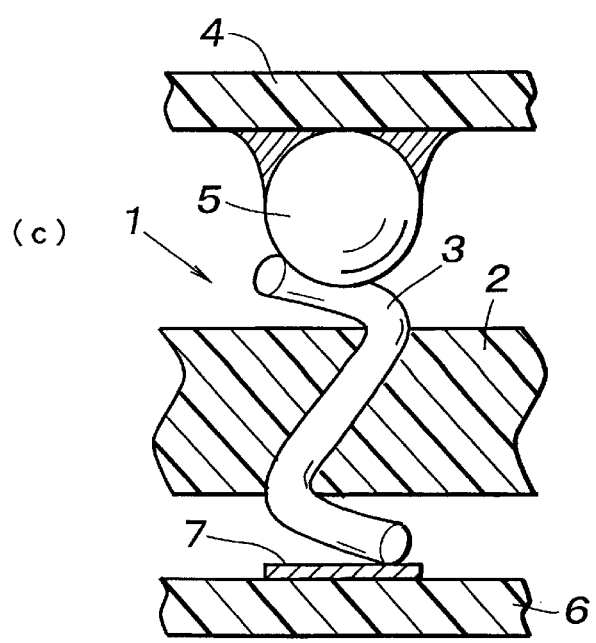

Now the preferred embodiments of the present invention are described in the following with reference to the appended drawings.

FIG. 1(a) is an enlarged sectional view of an essential part of a socket 1 for a semiconductor device. This socket 1 for a semiconductor device essentially consists of an insulating base board 2 incorporated with a plurality of resilient coil-shaped electroconductive members 3. For the convenience of illustration, only one of a plurality of electroconductive members is shown in this and most of the other drawings. This coil-shaped electroconductive member 3 consists of a resilient compression coil member of an approximately single turn which is somewhat axially extended, and its coil pitch or lead is less than the thickness of the insulating base board 2 so that the two ends of the coil-shaped electroconductive member 3 extend from either side of the insulating base board 2 while the remaining intermediate part of the coil-shaped electroconductive member 3 is fixedly insert molded in the insulating base board 2. However, the coil-shaped electroconductive member 3 may also include slightly less than a single turn or include slightly more than a single turn.

The mode of use of this socket 1 for a semiconductor device is illustrated in FIG. 1(c). As shown in the drawings, the socket 1 constructed as an embodiment of the electric contact unit according to the present invention is adapted to be interposed between a semiconductor device 4 and a circuit board 6 serving as mutually opposing parts to be contacted. A plurality of electroconductive balls 5 are attached, by soldering or other means, to the lower surface of the semiconductor device 4 as lead terminals for the semiconductor device 4, and an electroconductive terminal pattern 7 is provided on the circuit board 6 placed opposite to the semiconductor device 4 as the other part to be electrically contacted. The semiconductor device 4 may be either directly used in the present invention or may be mounted in BGA, CSP and other packages before applying the present invention.

The socket 1 is thus interposed between the ball 5 and the terminal pattern 7 so that the two ends of the coil-shaped electroconductive member 3 may resiliently contact the ball 5 and the terminal pattern 7, respectively. The semiconductor device 4 and the circuit board 6 are secured to a bracket not shown in the drawing so that the parts of coil-shaped electroconductive member 3 projecting from the base board 2 are resiliently deflected to a certain extent.

As a result, the axial end portions of the coil-shaped electroconductive member 3 resiliently abut the ball 5 and the terminal pattern 7, respectively. The ball 5 typically consists of a solder ball, and the resilient force is sufficient to break an oxide surface film thereof so that a stable electric contact can be established. In particular, in this embodiment, the axially projecting parts of the coil-shaped electroconductive members each consist of a wire end which extends at a certain angle away from the major surface of the base board. According to this embodiment, because each of the axial ends of the coil-shaped electroconductive member 3 is arcuate in shape, not only a bending deformation but also a torsional deformation occurs in the coil wire forming the electroconductive member 3 so that a high and durable resilient force can be produced. Even when the coil-shaped electroconductive member 3 extends out of the base board 2 by a substantial length, its axial extent is relatively limited, and the overall height of the socket 1 can be easily controlled to a small value.

Figure 2:
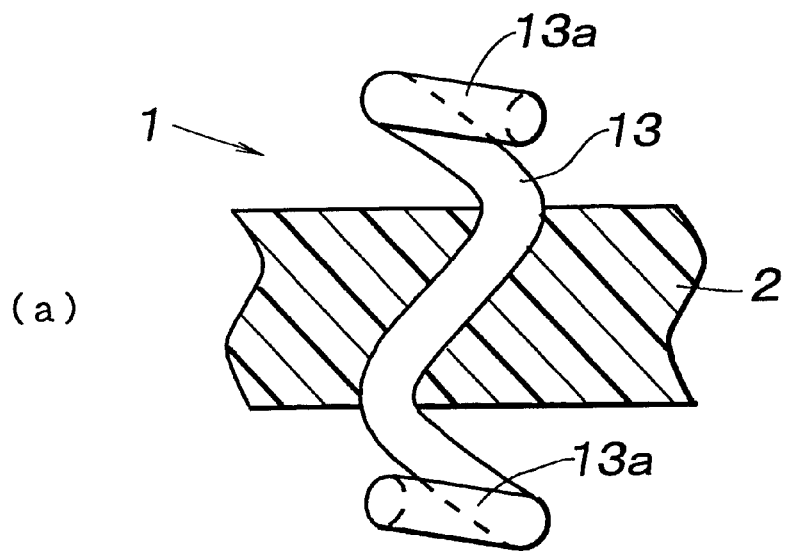
FIG. 2(a) is an enlarged sectional side view of an essential part of a socket for a semiconductor device given as an embodiment modified from that of FIG. 1.
FIG. 2(b) is an enlarged sectional side view essentially showing the mode of use of the socket for a semiconductor device shown in FIG. 2(a)
Figure 2:
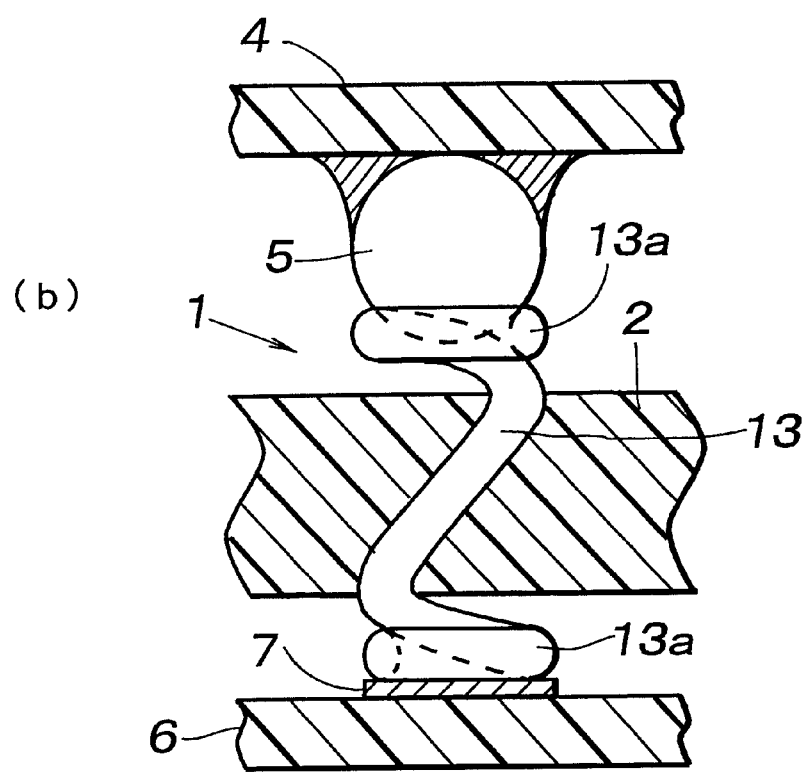

FIG. 2 shows a modification of the embodiment of FIG. 1. The parts corresponding to those of the previous embodiment are denoted with like numerals, and some of the description of such parts is omitted for the sake of brevity. Referring to FIG. 2(a), the coil-shaped electroconductive member 13 is supported by the insulating base board 2 in a similar fashion, but the length of the parts 13a of the electroconductive member 13 extending out of the insulating base board 2 are each longer than that shown in FIG. 1, and each end portion 13a thereof is coiled in a plane which is somewhat tilted with respect to a plane perpendicular to the axial line of the coil-shaped electroconductive member 3 or the major surface of the base board 2. In other words, the axially projecting parts of the coil-shaped electroconductive members each comprise a wire end which extends at a certain angle toward the major surface of the base board. Optionally, the axially projecting parts of the coil-shaped electroconductive members may each comprise a wire end which extends substantially in parallel with the major surface of the base board.

Owing to this arrangement, when the coil-shaped electroconductive member 3 is brought into contact with the ball 5 and the terminal pattern 7 in the same manner as that shown in FIG. 1, the coil-shaped electroconductive member 3 abuts the ball 5 and the terminal pattern 7 by a plane (or a line), in each case, as illustrated in FIG. 2(*b*). This is beneficial when any damage to the parts to be contacted is desired to be avoided because the surfaces are free from any oxide film or because the oxide film is extremely thin. Furthermore, when each end portion 13*a* is coiled in a plane which is somewhat tilted with respect to the major surface of the base board 2, because an intermediate part of an arcuate section at each axially projecting part of the coil-shaped electroconductive member 3 abuts the part to be contacted before its sharp coil wire end abuts the part to be contacted, the damage to the parts to be contacted can be minimized.

Figure 3:
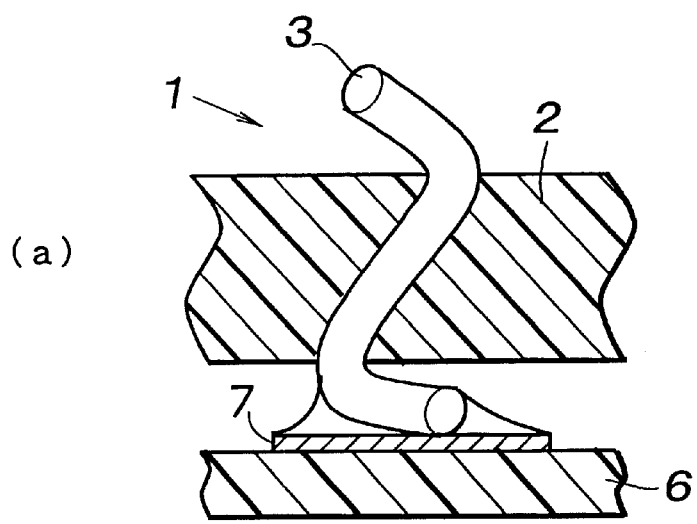
FIG. 3(a) is an enlarged sectional side view showing an alternate embodiment to that of FIG. 1.
FIG. 3(b) is an enlarged sectional side view essentially showing the mode of use of the socket for a semiconductor device shown in FIG. 3(a)
Figure 3:
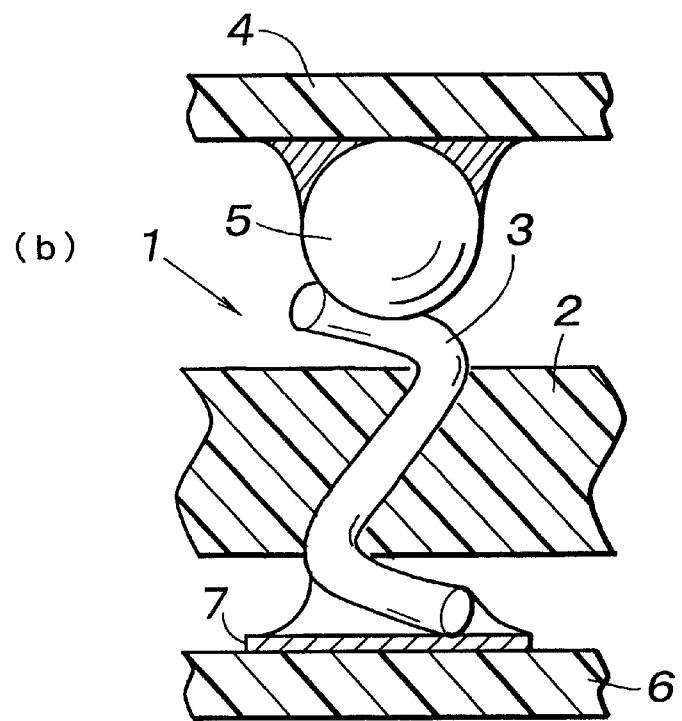
Figure 4:
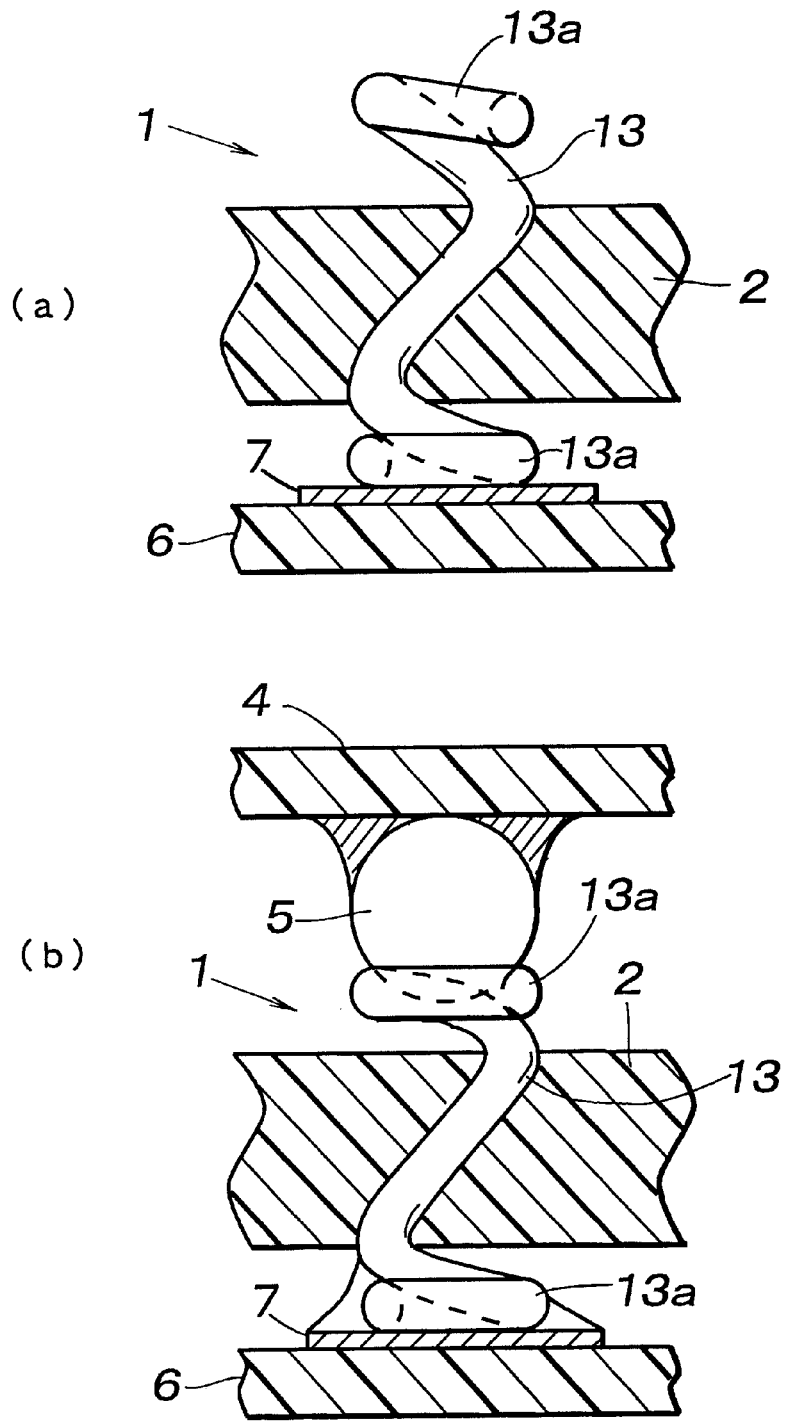
FIG. 4(a) is an enlarged sectional side view showing an alternate embodiment to that of FIG. 2.
FIG. 4(b) is an enlarged sectional side view essentially showing the mode of use of the socket for a semiconductor device shown in FIG. 4(a)

The socket was simply interposed between the parts to be contacted in the embodiments illustrated in FIGS. 1 and 2, but it is also possible to fixedly secure one side of the socket 1 to one of the parts to be contacted (the circuit board 6 in the illustrated embodiments) as illustrated in FIG. 3 and 4 by soldering or the like. In the illustrated embodiments, the ball 5 serving as a lead pin of the semiconductor device 4 is contacted in a similar manner as those shown in FIGS. 1 and 2.

In each of the coil-shaped electroconductive members 3 and 13 illustrated in FIGS. 1 to 4, the coil consists of approximately one turn over the entire length of the coil wire. Therefore, the electric current is not conducted via a plurality of turns of the spiral path, and is conducted through a substantially straight path so that an increase in the inductance can be avoided as opposed to the arrangement using a coil-shaped electroconductive path involving a plurality of turns, and the overall axial length can be reduced. The overall electric resistance can be also reduced.

Figure 5:
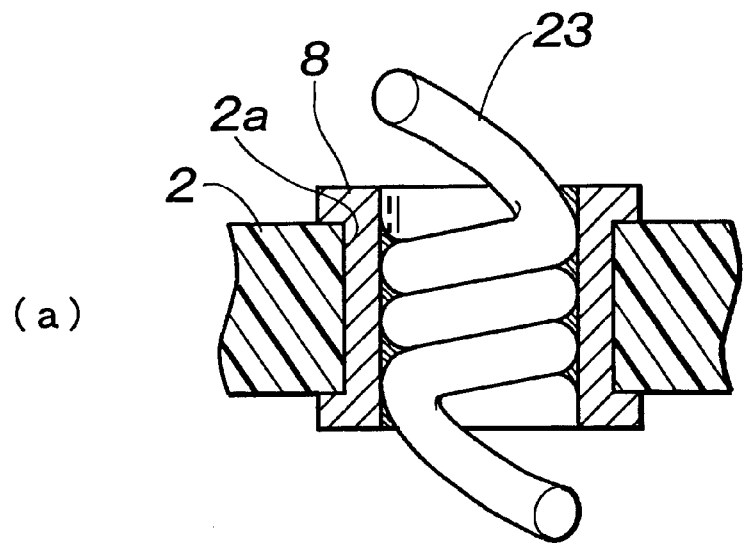
FIG. 5(a) is a view similar to FIG. 1(a) showing an embodiment employing a coil-shaped electroconductive member including a plurality of turns.
FIG. 5(b) is a view similar to FIG. 1(b) showing the embodiment employing a coil-shaped electroconductive member including a plurality of turns.
Figure 5:
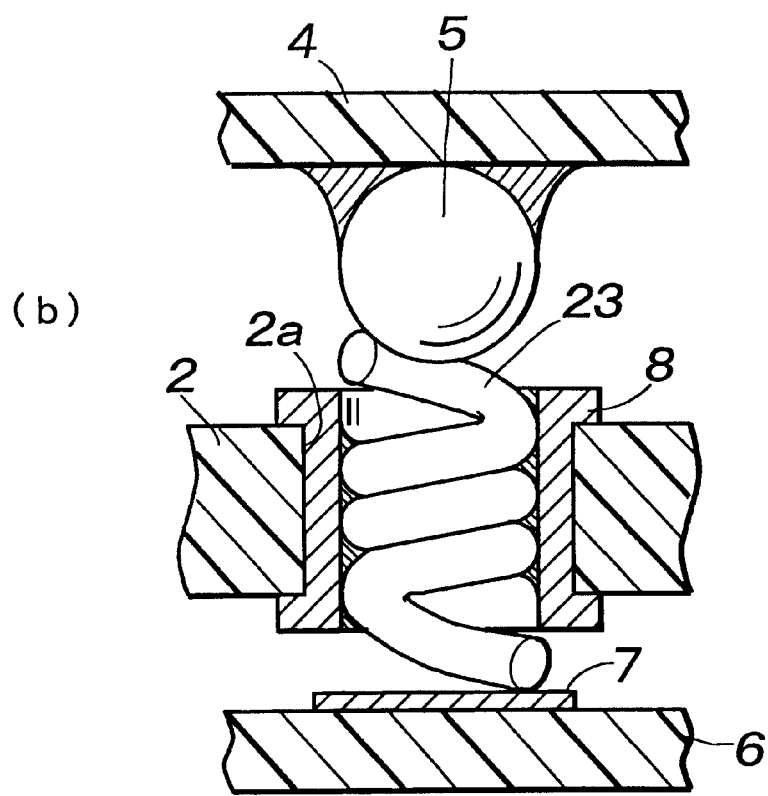
Figure 6:
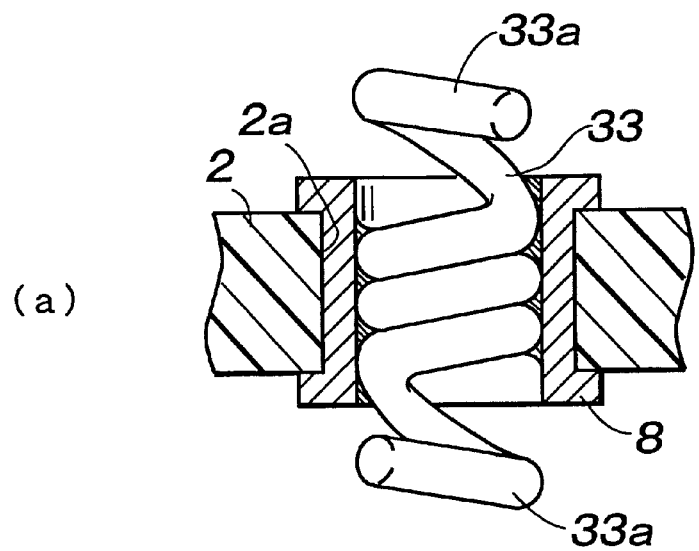
FIG. 6(a) is a view similar to FIG. 2(a) showing an embodiment employing a coil-shaped electroconductive member including a plurality of turns.
FIG. 6(b) is a view similar to FIG. 2(b) showing the embodiment employing a coil-shaped electroconductive member including a plurality of turns.
Figure 6:
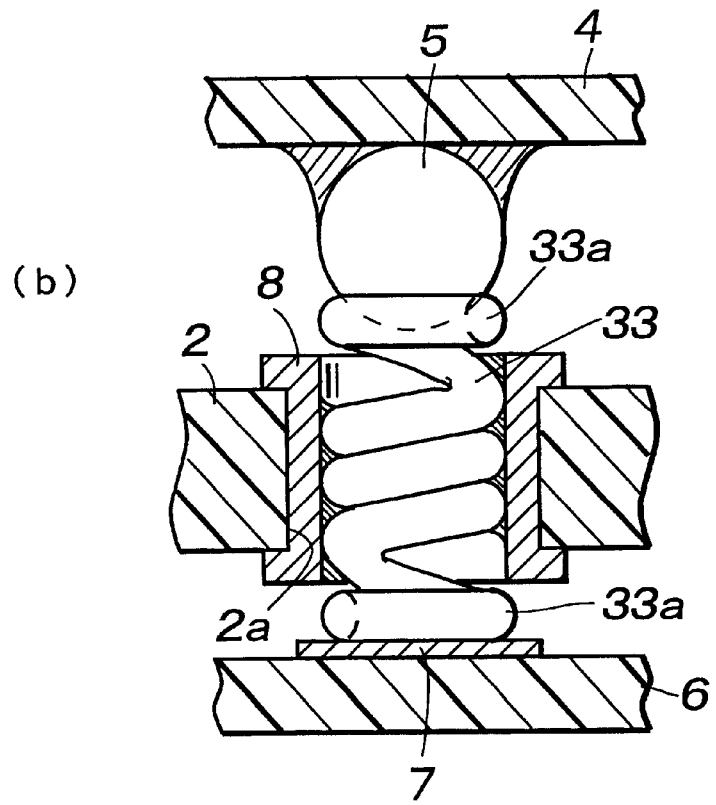

FIGS. 5 and 6 show embodiments using coil-shaped electroconductive members 23 and 33 having a plurality of turns. The parts corresponding to those of the previous embodiment are denoted with like numerals, and some of the description of such parts is omitted for the sake of brevity. In these embodiments, the part of the coil-shaped electroconductive member 23 or 33 extending out of the insulating base board 2 includes an approximately one turn of the coil wire. The insulating base board 2 is provided with through holes 2*a*, and the inner surface of each through hole 2*a* is plated with electroconductive material so as to form an electroconductive through hole 8. An intermediate part of the coil-shaped electroconductive member 23 or 33 is received in the electroconductive through hole 8, and is fixedly secured thereto by soldering, brazing or the like. The part of the coil-shaped electroconductive member 23 or 33 extending out of the insulating base board 2 which was mentioned above may be more accurately defined as a part which is capable of deflection.

The shape of the part of the coil-shaped electroconductive member 23 of FIG. 5 extending out of the insulating base board 2 is similar to that shown in FIG. 1, and the shape of the part of the coil-shaped electroconductive member 33 of FIG. 6 extending out of the insulating base board 2 is similar to that shown in FIG. 2. The modes of operation of the embodiments illustrated in FIGS. 5 and 6 are also similar to those of the embodiments illustrated in FIGS. 1(*c*) and 2(*b*), and are illustrated in FIGS. 5(*b*) and 6(*b*). The advantageous features of these embodiments with respect to the balls to be contacted are similar to those of the previous embodiments. Likewise, the part 33*a* of the coil-shaped electroconductive member 33 extending out of the insulating base board 2 is similar in shape to that 13*a* shown in FIG. 2, and the advantages thereof are also similar to those of the embodiment shown in FIG. 2.

The coil-shaped electroconductive members 23 and 33 of FIGS. 5 and 6 each include a plurality of turns over its entire length, but because the part of the coil-shaped electroconductive member 23 or 33 received in the insulating board 2 is soldered or brazed to the electroconductive through hole 8, electric current passes straight through the through hole 8. Therefore, even though the coil-shaped electroconductive member 23 or 33 includes a plurality of turns, the flow of electric current is substantially straight through the through hole 8 and passes through a substantially shortest possible path across the thickness of the insulating base board 2 so that the inductance can be favorably reduced.

This arrangement of securing the coil-shaped electroconductive member 23 or 33 to the electroconductive through hole 8 simplifies the process of mounting the coil-shaped electroconductive member 23 or 33 to the insulating base board 2 as opposed to the embodiments requiring the coil-shaped electroconductive member to be insert molded or otherwise mounted on the insulating base board. If the plating material for the through hole 8 consists of solder, the assembling of the coil-shaped electroconductive member 23 or 33 by soldering is particularly simplified.

Figure 7:
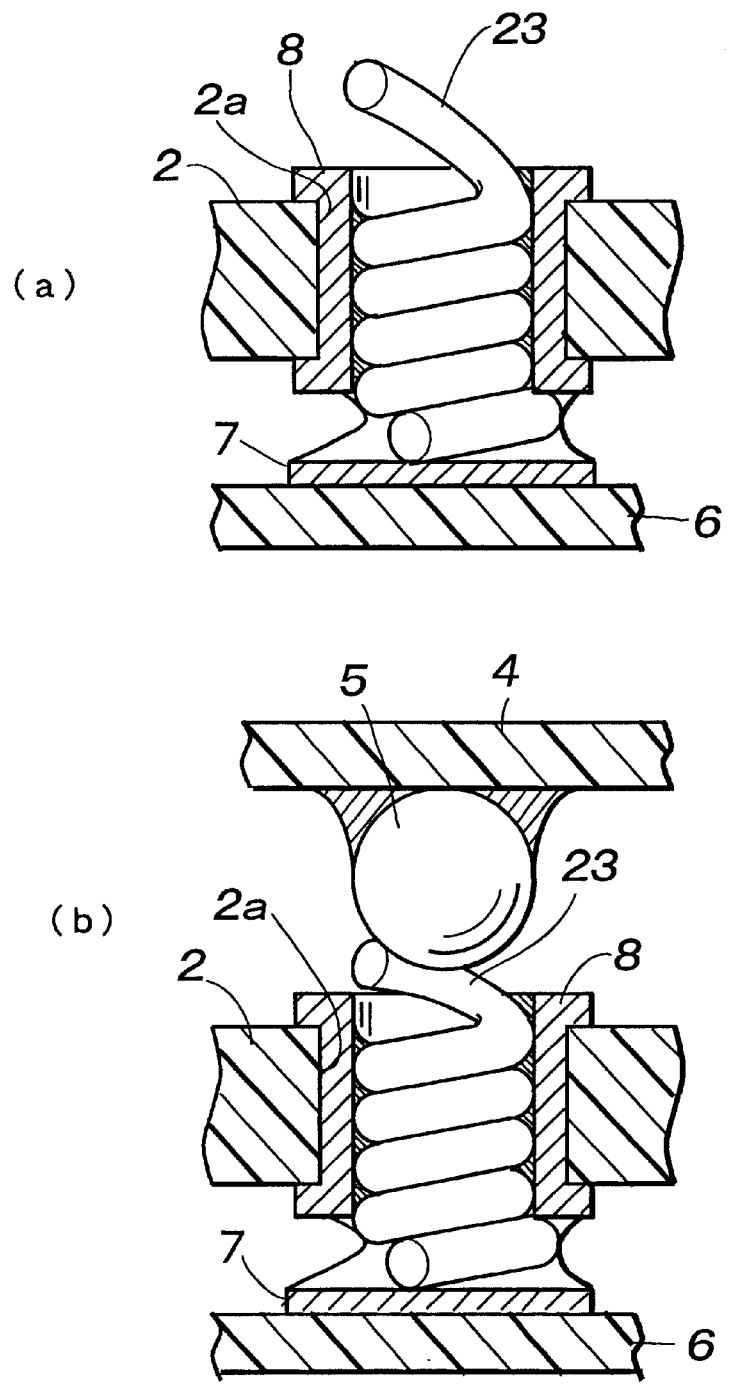
FIG. 7(a) is a view similar to FIG. 3(a) showing an embodiment employing a coil-shaped electroconductive member including a plurality of turns.
FIG. 7(b) is a view similar to FIG. 3(b) showing the embodiment employing a coil-shaped electroconductive member including a plurality of turns.
Figure 8:
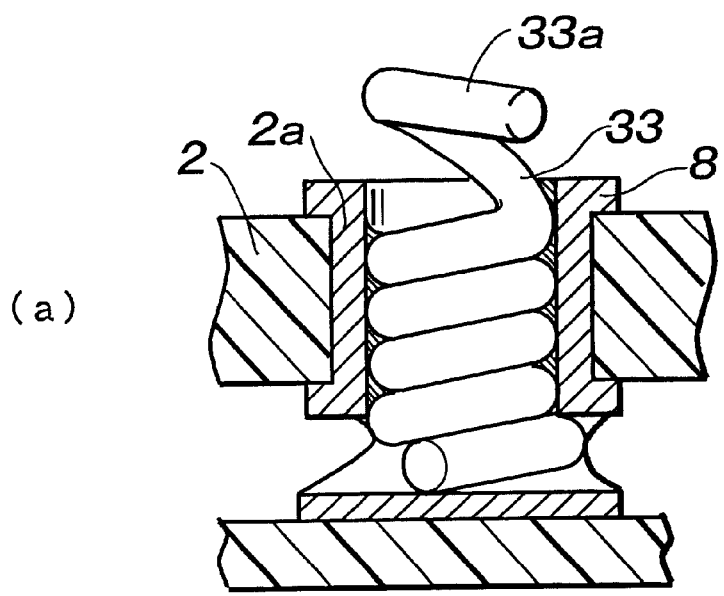
FIG. 8(a) is a view similar to FIG. 4(a) showing an embodiment employing a coil-shaped electroconductive member including a plurality of turns.
FIG. 8(b) is a view similar to FIG. 4(b) showing the embodiment employing a coil-shaped electroconductive member including a plurality of turns.
Figure 8:
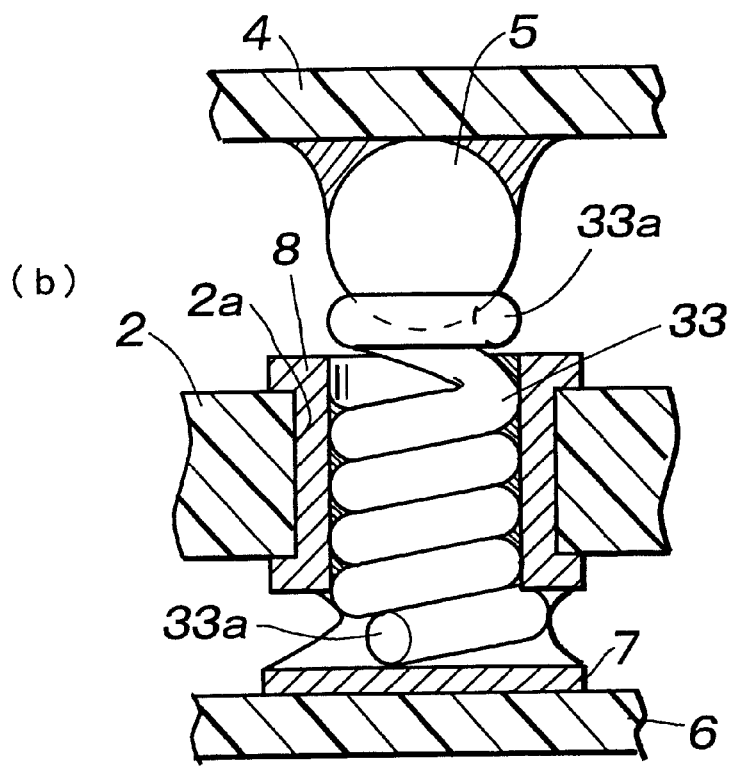
Figure 9:
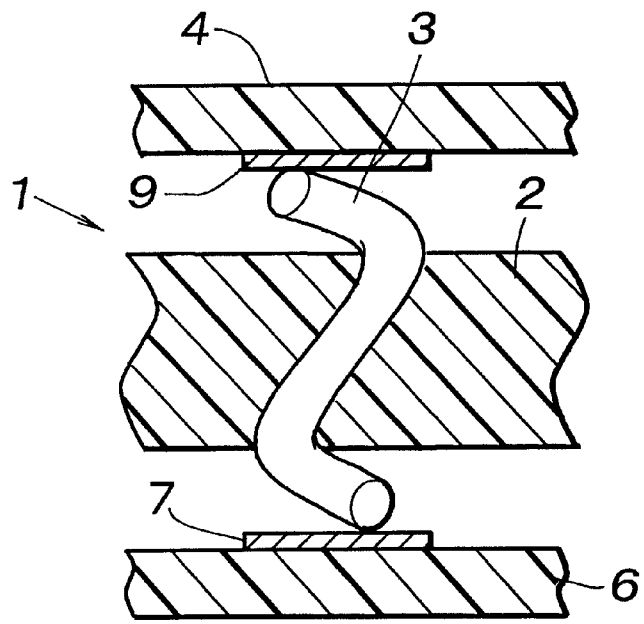
FIG. 9 is a view similar to FIG. 1(c) showing an alternate mode of use of the embodiment of FIG. 1.
Figure 10:
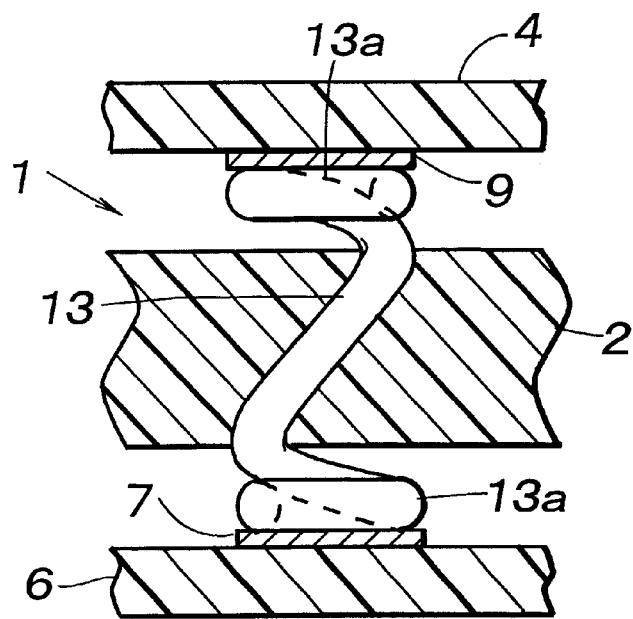
FIG. 10 is a view similar to FIG. 2(b) showing an alternate mode of use of the embodiment of FIG. 2.
Figure 11:
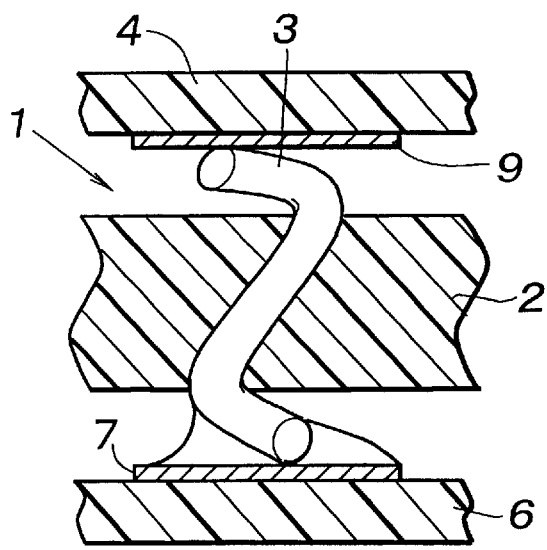
FIG. 11 is a view similar to FIG. 3(b) showing an alternate mode of use of the embodiment of FIG. 3.
Figure 12:
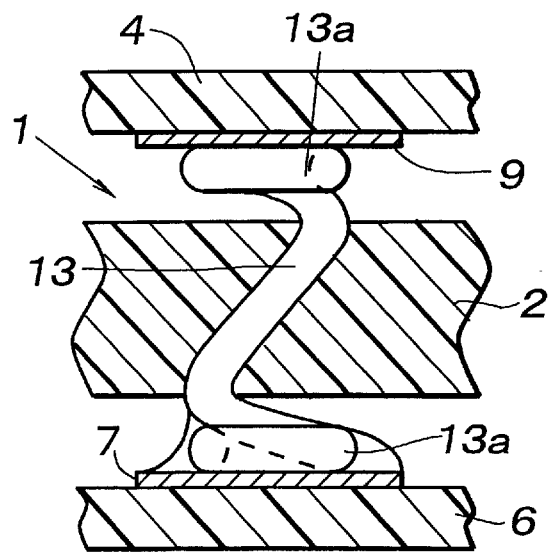
FIG. 12 is a view similar to FIG. 4(b) showing an alternate mode of use of the embodiment of FIG. 4.
Figure 13:
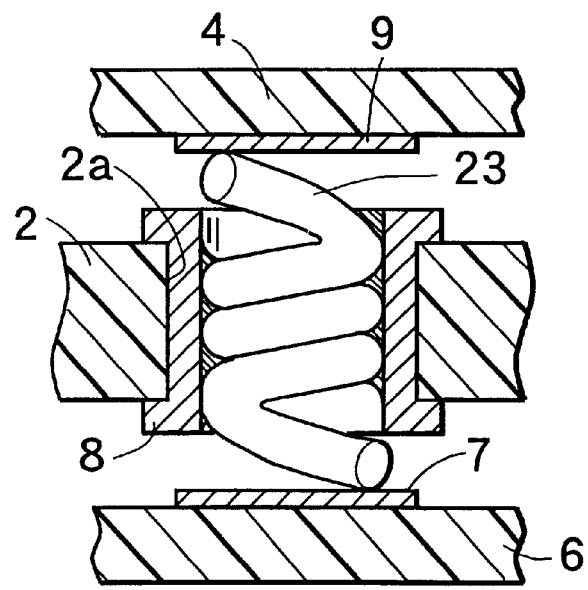
FIG. 13 is a view similar to FIG. 5(b) showing an alternate mode of use of the embodiment of FIG. 5.
Figure 14:
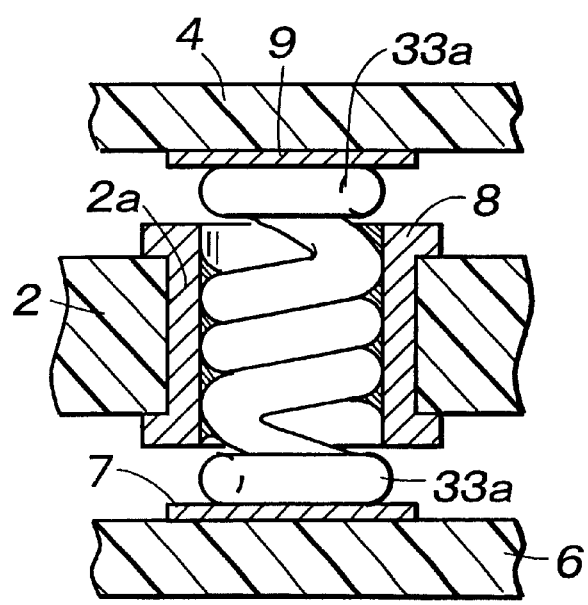
FIG. 14 is a view similar to FIG. 6(b) showing an alternate mode of use of the embodiment of FIG. 6.
Figure 15:
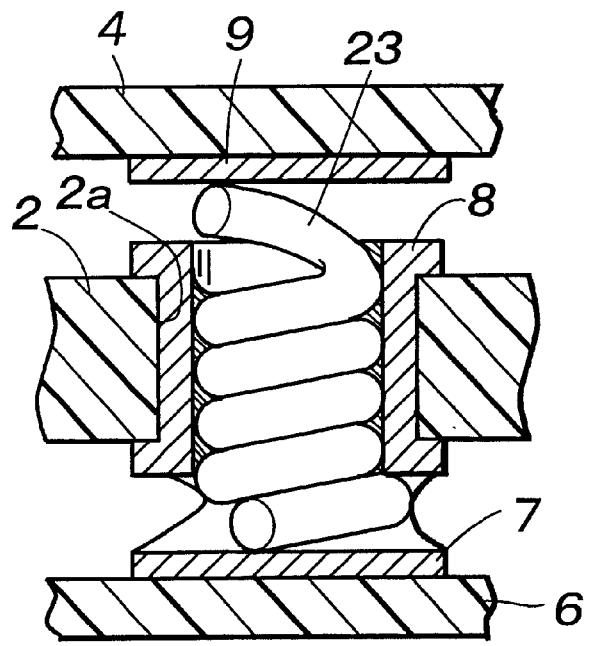
FIG. 15 is a view similar to FIG. 7(b) showing an alternate mode of use of the embodiment of FIG. 7.
Figure 16:
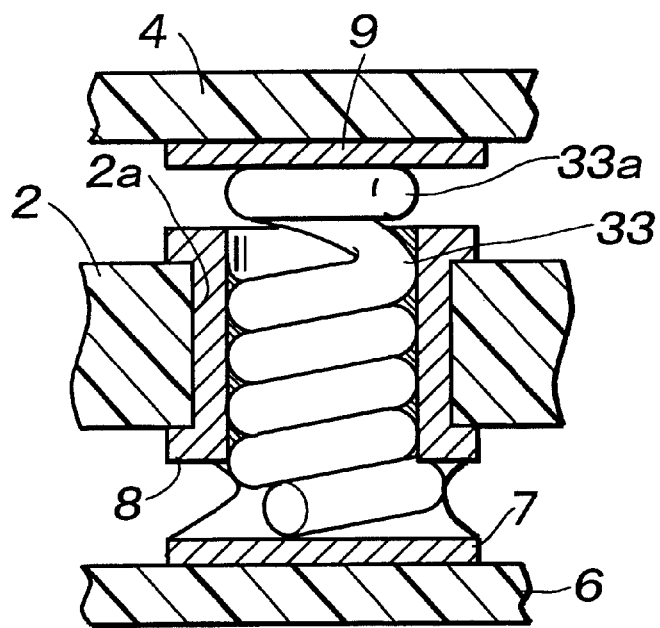
FIG. 16 is a view similar to FIG. 8(b) showing an alternate mode of use of the embodiment of FIG. 3.
Figure 17:
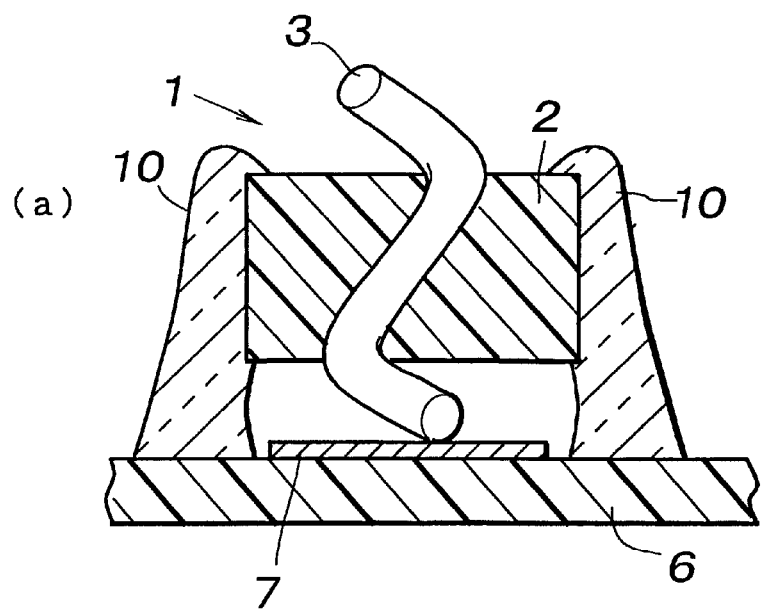
FIG. 17(a) is a view similar to FIG. 3(a) and FIG. 17(b) is a view similar to FIG. 3(a) both showing an alternate embodiment to that of FIG. 3.
Figure 17:
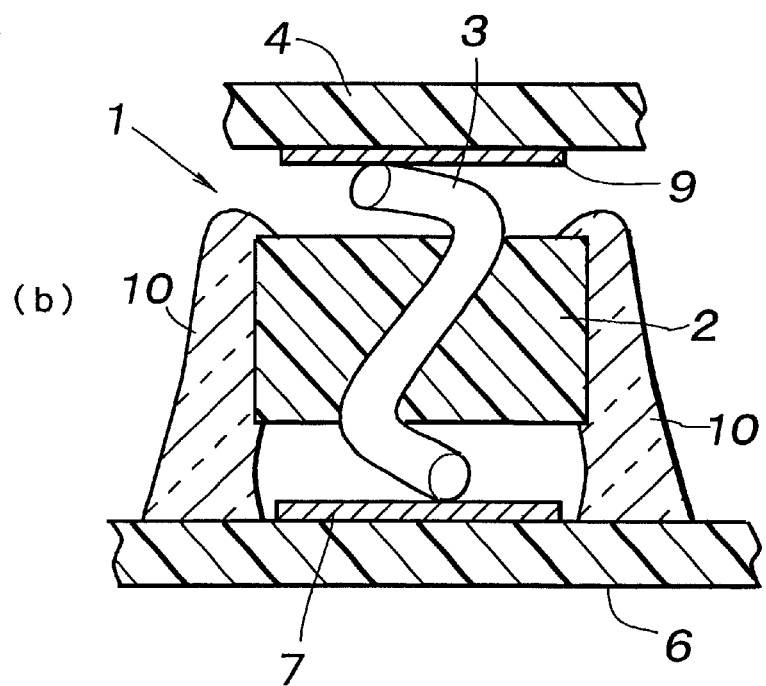
Figure 18:
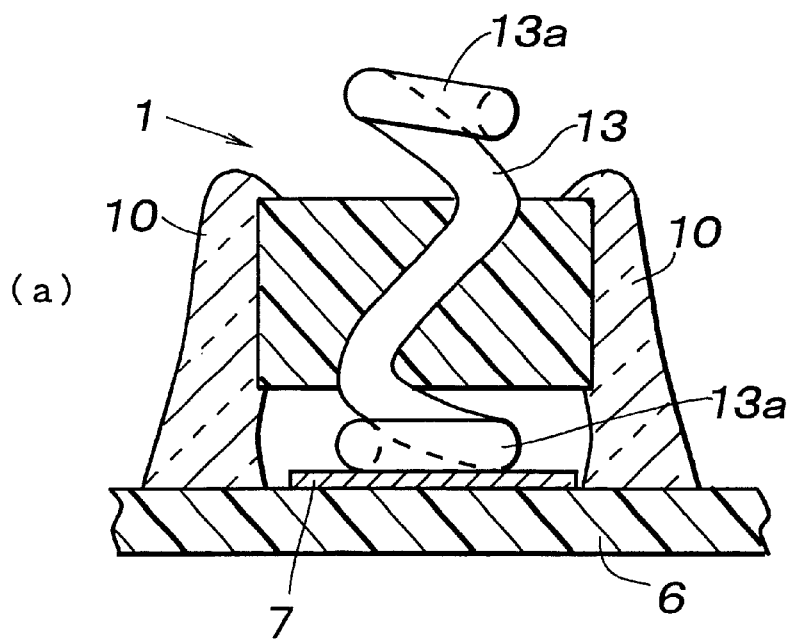
FIG. 18(a) is a view similar to FIG. 4(a) and FIG. 18(b) is a view similar to FIG. 4(a) both showing an alternate embodiment to that of FIG. 4.
Figure 18:
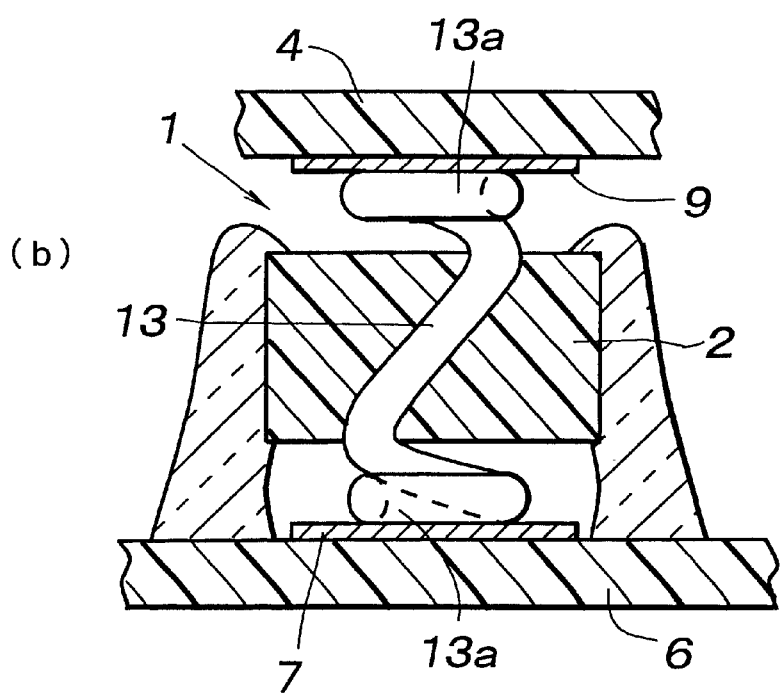
Figure 19:
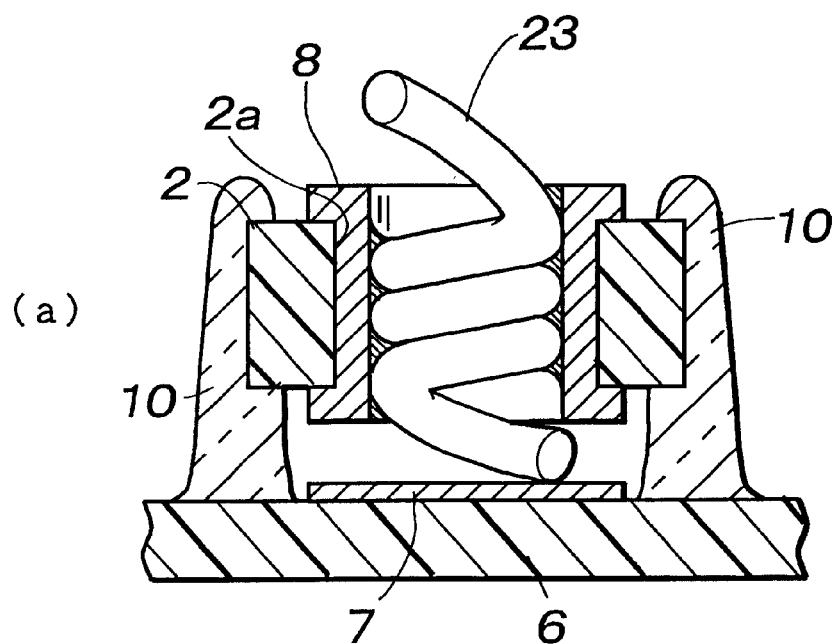
FIG. 19(a) is a view similar to FIG. 5(a) and FIG. 19(b) is a view similar to FIG. 5(a) both showing an alternate embodiment to that of FIG. 5.
Figure 19:
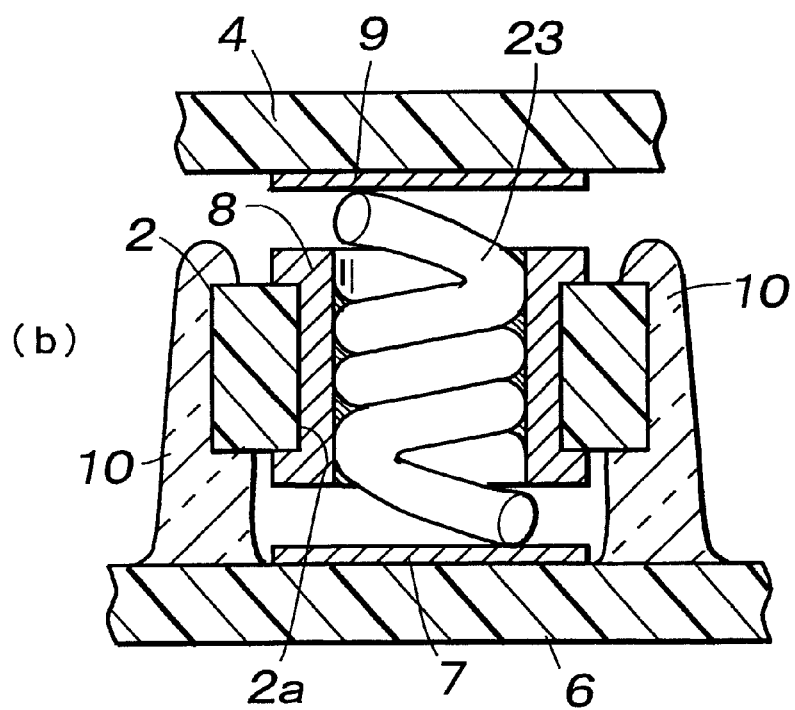
Figure 20:
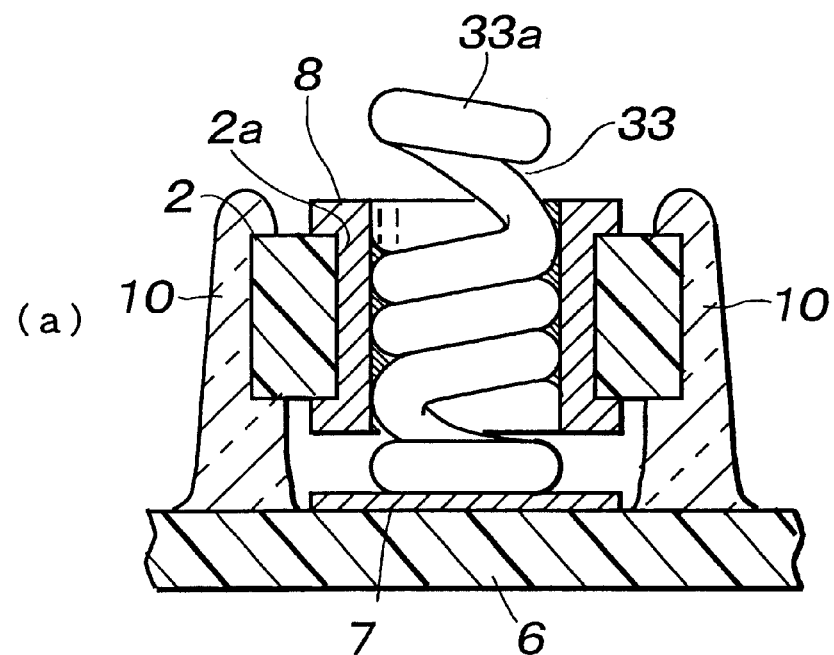
FIG. 20(a) is a view similar to FIG. 6(a) and FIG. 20(b) is a view similar to FIG. 6(a) both showing an alternate embodiment to that of FIG. 6.
Figure 20:
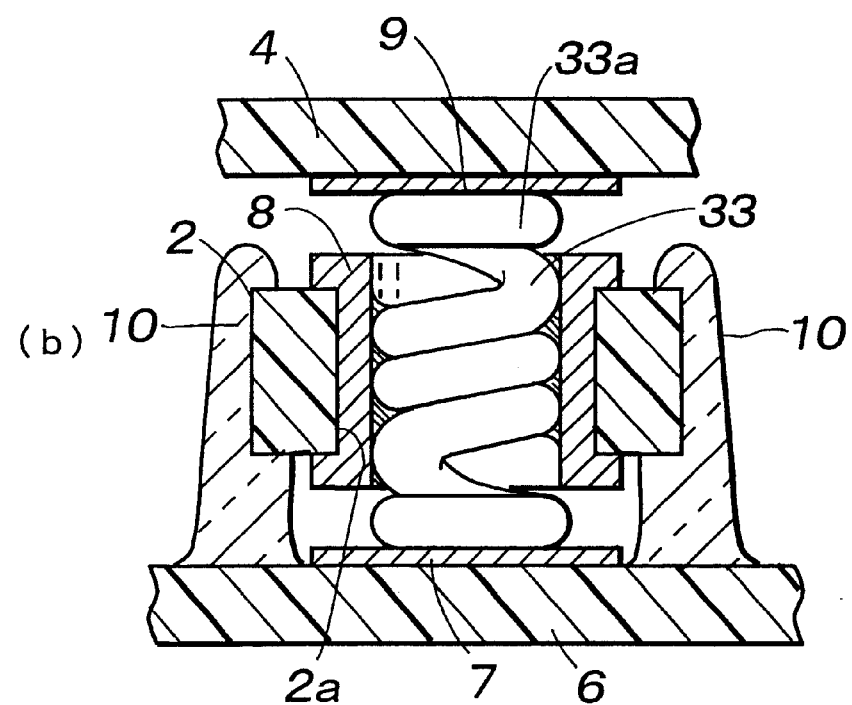

FIGS. 7 and 8 show different embodiments in which the coil-shaped electroconductive members 23 and 33 shown in FIGS. 5 and 6 are used, and the sockets are each attached to one of the parts to be contacted (the circuit board 6 in these cases) by soldering or the like on one side thereof similarly to those illustrated in FIGS. 3 and 4. The common letters (a) and (b) following the figure numbers indicate the mutual correspondence between different embodiments. The parts corresponding to those of the preceding embodiments are denoted with like numerals, and the detailed description of some of such parts is omitted for the save of brevity.

The embodiments shown in FIGS. 7 and 8 provide advantages similar to those of the preceding embodiments. By making the outer diameter of the coil on the circuit board 6 end of the coil-shaped electroconductive member 23 or 33 slightly larger than the inner diameter of the through hole 8, the movement of the coil-shaped electroconductive member 23 or 33 upward out of the through hole 8 as seen in the drawings can be prevented, and the axial positioning of the coil-shaped electroconductive member 23 or 33 can be simplified.

The parts to be contacted consisted of balls 5 and terminal patterns 7 in the embodiments illustrated in FIGS. 1 to 8, but this should not restrict the possible configurations of the parts to be contacted. For instance, FIGS. 9 to 16 show embodiments in which the semiconductor devices 4 are provided with lands (terminal patterns) 9, instead of the balls 5 used in the previous embodiments, for the lead pins of the semiconductor devices 4. FIGS. 9 to 16 correspond to FIGS. 1(*b*) to 8(*b*), in that order, but because the structures of the sockets 1 shown FIGS. 9 to 16 in themselves are no different from the corresponding sockets of the preceding embodiments, the parts corresponding to the preceding embodiments are simply denoted with like numerals without repeating the detailed description thereof. The advantages of these embodiments are also no different from those of the preceding embodiments with the only difference being found in the shape of one of the parts to contacted.

FIGS. 17 to 20 show embodiments in which the insulating base board 2 is secured to the circuit board 6 by using a sealant 10 which may consist of a 3 bonding agent, instead of soldering one of the coil-shaped electroconductive member 3 of the socket 1 to the terminal pattern of the circuit board 6 as was the case in the embodiments illustrated in FIGS. 3 to 6, so that one of the coil-shaped electroconductive member 3 may be resiliently engaged to the terminal pattern 7 of the circuit board 6. Similarly, the figure numbers accompanying (a) correspond to each other, and the figure numbers accompanying (b) likewise correspond to each other.

According to this arrangement, the use of solder or lead can be minimized as opposed to the case of using solder, but the contact properties of these embodiments are similar to those of the embodiments illustrated in FIGS. 1 and 2.

The material for the coil-shaped electroconductive member may preferably consist of a copper based or gold based material or a piano wire depending on the desired electric properties and durability and according to the importance of the application.

The above described embodiments were each described in terms of an individual coil-shaped electroconductive member, but when it is applied to a socket for an LSI, a plurality of such coil-shaped electroconductive members corresponding in number to the lead pins of the LSI are arranged in a matrix. Such an embodiment is illustrated in FIGS. 21 and 22.

Figure 21:
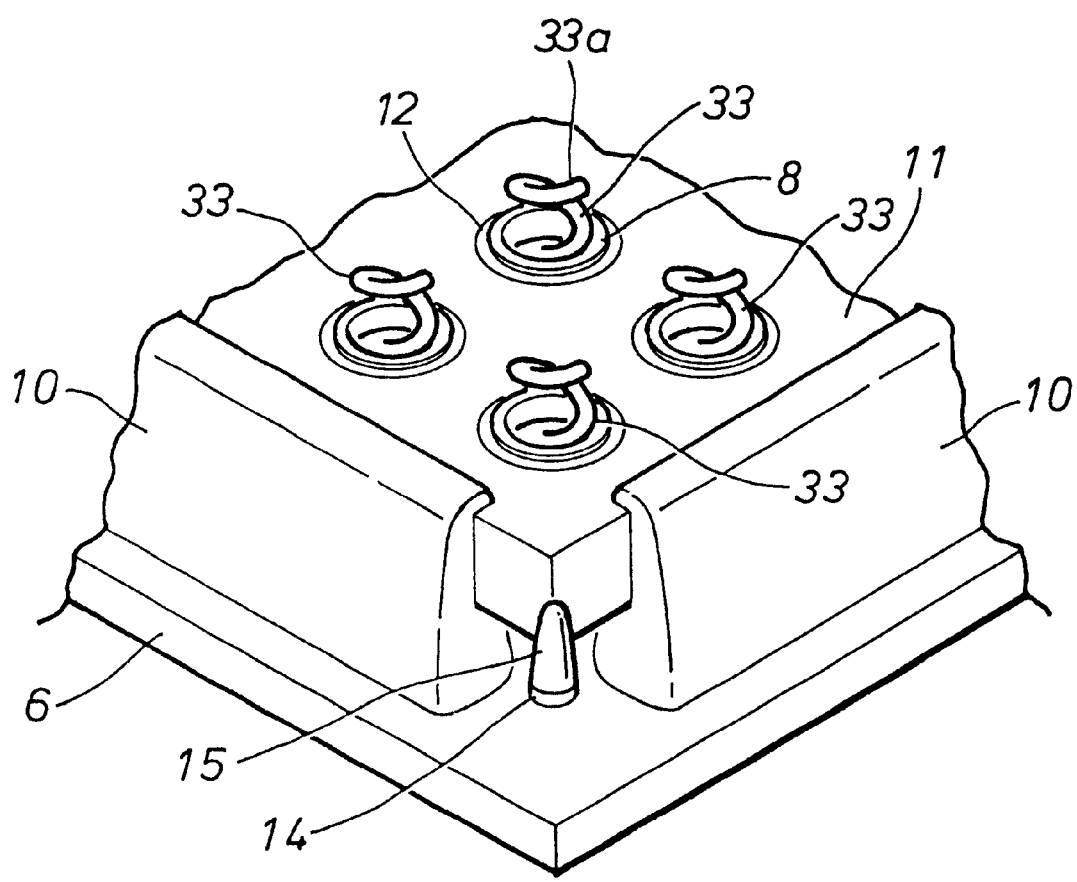
FIG. 21 is a fragmentary perspective view showing the mode of use of a socket.
Figure 22:
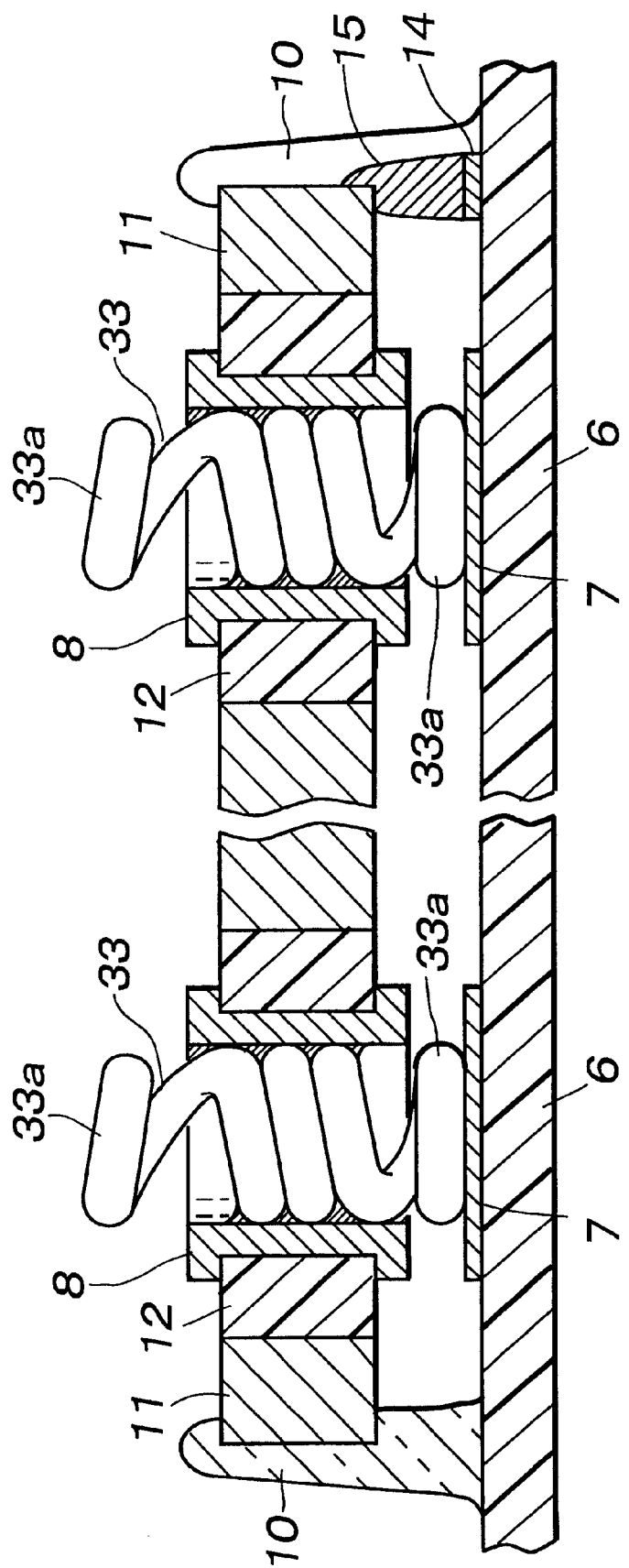
FIG. 22 is a sectional side view of the socket of FIG. 21.

FIG. 21 is a fragmentary perspective view of a part of the socket, and FIG. 22 is a sectional side view of an essential part of the socket. In this embodiment, the socket main body 11 is made of electroconductive metallic material, and a plurality of holes are formed in the socket main body 11 in the manner of punched sheet metal. A tubular insulating member 12 is fixedly fitted into each of the holes in a coaxial arrangement. An electroconductive through hole 8 is formed in the inner surface of each tubular insulating member 12 in a similar fashion to the embodiment illustrated in FIG. 20. A coil-shaped electroconductive member 33 is passed through each of the through holes 8, and is secured therein, for instance, by soldering. The socket main body 11 is attached to the circuit board 6 by using a sealant 10 so that one projecting end 33a of the coil-shaped electroconductive member 33 is resiliently engaged to the terminal pattern 7 formed on the circuit board 6. A part of the socket main body 11 is electrically connected to a ground terminal pattern 14 of the circuit board 6 via a grounding line 15 so that the socket main body 11 may be properly grounded.

By thus forming the socket, it is possible to avoid any electric interferences between adjacent coil-shaped electroconductive members even when high frequency signals are passed through these coil-shaped electroconductive members.

Figure 23:
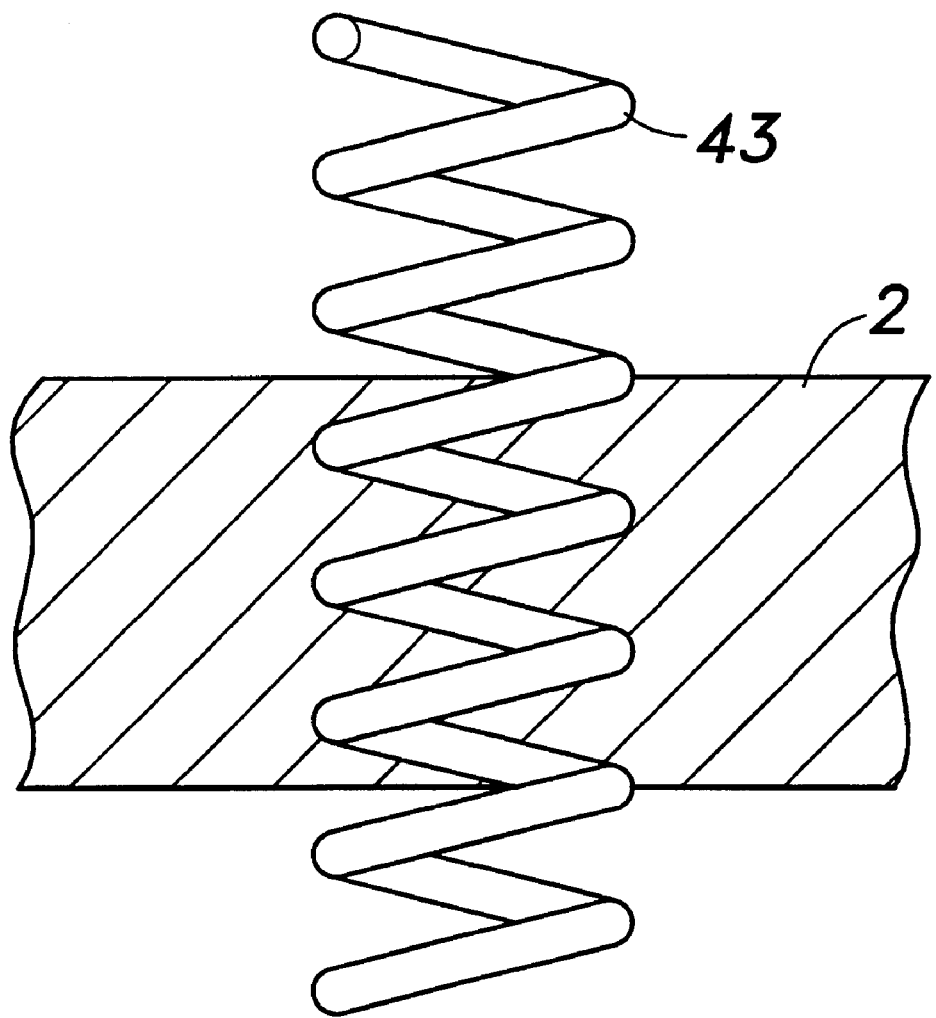
FIG. 23 is a view similar to FIG. 1(a)

FIG. 23 is a view similar to FIG. 1(a) showing yet another embodiment of the present invention. In this drawing, the parts to be contacted are omitted from illustration, and the parts corresponding to those of the previous embodiments are denoted with like numerals.

The coil-shaped electroconductive member 43 includes a part fixedly secured to the insulating base board 2, and a pair of parts projecting from respective sides of the insulating base board 2, and each of these parts includes a plurality of turns. For instance, the entire electroconductive member may consist of ten turns. When the frequency of the signals to be processed is relatively low, conducting electric current through coils including a plurality of turns would not produce any significant ill effects. Involving a large number of turns in the electroconductive member provides the advantage of affording a sufficient resiliency in the contact with the parts to be contacted. In other words, depending on the relative significance of the spring property and the high frequency property which are required, the number of turns of the electroconductive member should be selected.

Figure 24:
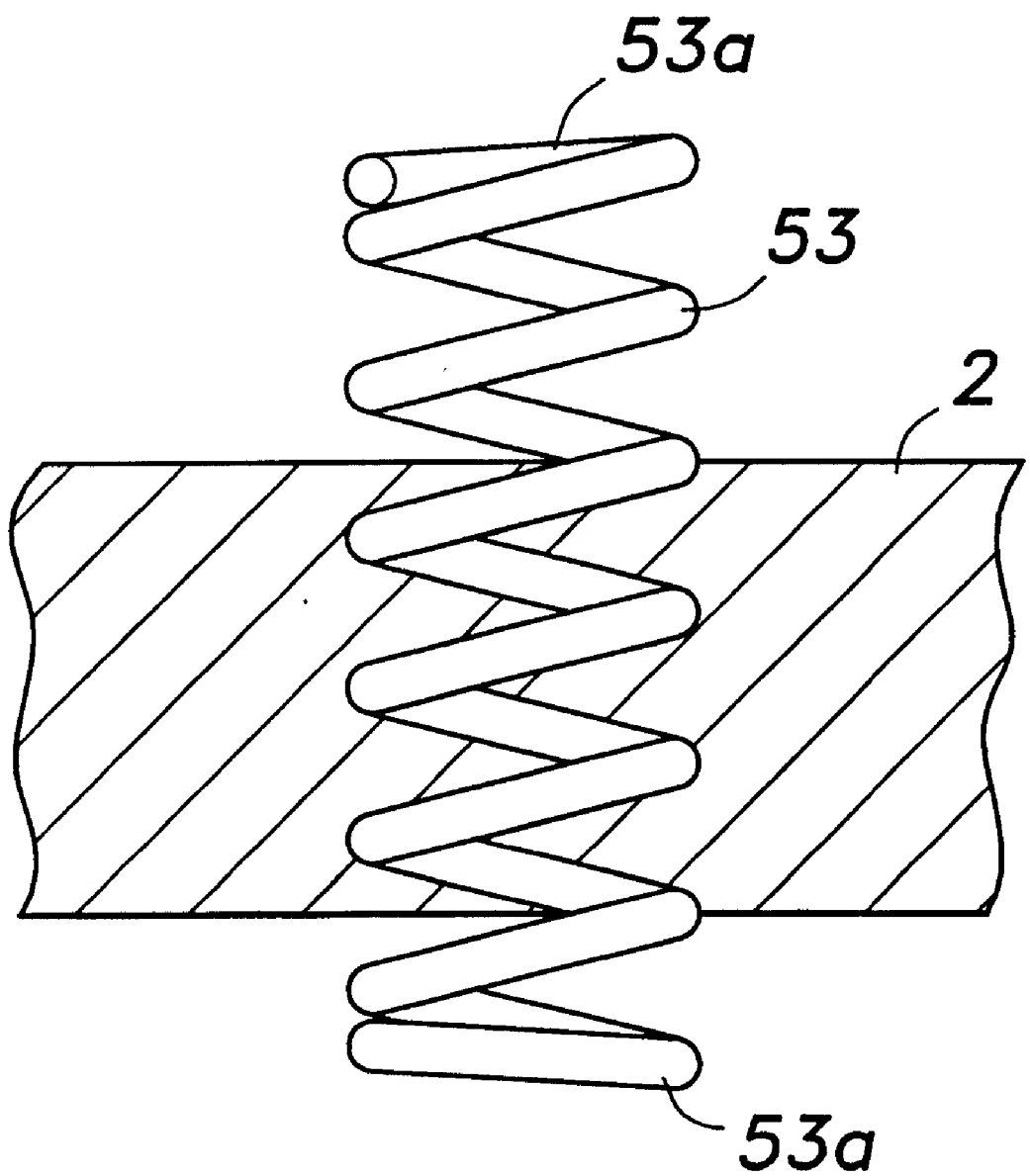
FIG. 24 is a view similar to FIG. 2(a) showing an embodiment modified from that of FIG. 23.

FIG. 24 is a view similar to FIG. 2(a) showing an embodiment modified from that of FIG. 23. In this drawing also, the parts to be contacted are omitted from illustration, and the parts corresponding to those of the previous embodiments are denoted with like numerals.

The coil-shaped electroconductive member 53 of FIG. 24 includes a same number of turns as the coil-shaped electroconductive member 43 of FIG. 23, and is supported in the insulating base board 2 in a similar fashion. Therefore, this embodiment provides similar advantages to those of the embodiment shown in FIG. 23. Additionally, the coil ends 53 are similar to those of the embodiment of FIG. 2, and this embodiment hence provides advantages similar to those of the embodiment shown in FIG. 2.

The above described embodiments were directed to the application to sockets for semiconductor devices, but the present invention is not limited to such applications but can be applied to a wide range of applications for electric connection between electronic components such as semiconductor devices, including electric connectors for semiconductor devices.

What I claim is:

1. An electric contact unit for conducting electric current between a pair of mutually opposing parts to be contacted, comprising:

a base board having a plurality of through holes passed therethrough;

a plurality of coil-shaped resilient and electroconductive members passed through corresponding ones of said through holes, wherein each coil-shaped member is wound around an axis unique to each member; and an insulator electrically insulating said coil-shaped electroconductive members from one another;

wherein each of said coil-shaped electroconductive members includes an intermediate part fixedly secured in the corresponding through hole and a pair of projecting parts projecting, along said axis and at approximately a right angle to a plane defined by said base board, from respective sides of said base board, wherein each projecting part has an outer diameter not less than the outer diameter of the intermediate part, and wherein each of said coil-shaped members is configured to conduct high frequency electric current at reduced inductance by said intermediate part and both of said projecting parts each including no more than approximately one turn.

2. An electric contact unit according to claim 1, wherein said base board comprises said insulator.

3. An electric contact unit according to claim 2, wherein said intermediate part of each of said coil-shaped electroconductive members in insert molded in said base board.

4. An electronic contact unit according to claim 1, wherein said base board is an electroconductive metallic board, and said insulator comprises a tubular insulating member received in each of said through holes and configured to receive a corresponding one of said coil-shaped electroconductive members.

5. An electric contact unit according to claim 1, wherein at least one of said projecting parts of said coil-shaped electroconductive members comprises wire end which extends at a certain angle toward a major surface of said base board.

6. An electric contact unit according to claim 1, wherein at least one of said projecting parts of said coil-shaped electroconductive members comprises a wire end which extends substantially in parallel with the plane defined by said base board.

7. An electric contact unit according to claim 1, further comprising means for mounting said base board on a circuit board at a prescribed spacing defined therebetween.

8. An electric contact unit according to claim 1, wherein said electric contact unit is adapted as a socket for mounting a semiconductor device on a circuit board.

9. An electric contact unit according to claim 1, wherein said electric contact unit is adapted as an electric connector for electrically connecting a pair of opposing groups of parts to be contacted.

10. An electric contact unit for conducting electric current between a pair of mutually opposing parts to be contacted comprising:
- a base board having a plurality of through holes passed therethrough,
- a plurality of coil-shaped resilient and electroconductive members passed through corresponding ones of said through holes, wherein each coil-shaped member is wound around an axis unique to each member; and
- an insulator electrically insulating said coil-shaped electroconductive members from one another,
- wherein each of said coil-shaped electroconductive members includes an intermediate part fixedly secured in the corresponding through hole and a pair of projecting parts projecting, along said axis and at approximately a right angle to a plane defined by said base board, from respective sides of said base board, each axially projecting part having an outer diameter not less than the outer diameter of the intermediate part, and wherein each of said coil-shaped electroconductive members is configured to conduct high frequency electric current at reduced inductance by including no more than approximately one turn.

11. An electric contact unit according to claim 10, wherein said base board comprises said insulator.

12. An electric contact unit according to claim 11, wherein said intermediate part of each of said coil-shaped electroconductive members is insert molded in said base board.

13. An electric contact unit according to claim 10, wherein at least one of said projecting parts of said coil-shaped electroconductive members comprises a wire end which extends at a certain angle away from a major surface of said base board.

14. An electric contact unit according to claim 10, wherein at least one of said projecting parts of said coil-shaped electroconductive members comprises a wire end spaced apart from an adjacent coil turn and which extends at a certain angle toward a major surface of said base board.

15. An electric contact unit according to claim 10, wherein at least one of said projecting parts of said coil-shaped electroconductive members comprises a wire end which extends substantially in parallel with a major surface of said base board.

16. An electric contact unit according to claim 10, further comprising means for mounting said base board on a circuit board at a prescribed spacing defined therebetween.

17. An electric contact unit according to claims 10, wherein said electric contact unit is adapted as a socket for mounting a semiconductor device on a circuit board.

18. An electric contact unit for conducting electric current between a pair of mutually opposing parts to be contacted comprising:
- a base board having a plurality of through holes passed therethrough, wherein an interior surface of each of said through holes is plated with an electroconductive material;
- a plurality of coil-shaped resilient and electroconductive members passed through corresponding ones of said through holes, wherein each coil-shaped member is wound around an axis unique to each member; and
- an insulator electrically insulating said coil-shaped electroconductive members from one another,
- wherein each of said coil-shaped electroconductive members includes an intermediate part fixedly secured in the corresponding through hole and a pair of projecting parts projecting, along said axis and at approximately a right angle to a plane defined by said base board, from respective sides of said base board, each projecting part having an outer diameter not less than the outer diameter of the intermediate part, and coils of said intermediate part of each of said coil-shaped electroconductive members are configured to conduct high frequency electric current at reduced inductance by being soldered or brazed so as to contact each other and the corresponding electroconductive material in each through hole.

19. An electric contact unit according to claim 18, wherein said electric contact unit is adapted as an electric connector for electrically connecting a pair of opposing groups of parts to be contacted.

20. An electric contact unit according to claim 18, wherein said base board comprises said insulator.

21. An electric contact unit according to claim 18, wherein at least one of said projecting parts of said coil-shaped electroconductive members comprises a wire end which extends at a certain angle away from a major surface of said base board.

22. An electric contact unit according to claim 18, wherein at least one of said projecting parts of said coil-shaped electroconductive members comprises a wire end spaced apart from an adjacent coil turn and which extends at a certain angle toward a major surface of said base board.

23. An electric contact unit according to claim 18, wherein at least one of said projecting parts of said coil-shaped electroconductive members comprises a wire end which extends substantially in parallel with a major surface of said base board.

24. An electric contact unit according to claim 18, wherein at least one of said projecting parts of said coil-shaped electroconductive members comprises a wire end which is coiled around the axis and has an outer diameter that is somewhat greater than an associated inner diameter of the corresponding through hole.

25. An electric contact unit according to claim 18, further comprising means for mounting said base board on a circuit board at a prescribed spacing defined therebetween.

26. An electric contact unit according to claim 18, wherein said electric contact unit is adapted as a socket for mounting a semiconductor device on a circuit board.

27. An electric contact unit according to claim 18, wherein said electric contact unit is adapted as an electric connector for electrically connecting a pair of opposing groups of parts to be contacted.

28. An electric contact unit for conducting electric current between a pair of mutually opposing parts to be contacted, comprising:
- a base board having a plurality of through holes passed therethrough;
- a plurality of coil-shaped resilient and electroconductive members passed through corresponding ones of said through holes, wherein each coil-shaped member is wound around an axis unique to each member; and
- an insulator electrically insulating said coil-shaped electroconductive members from one another;
- wherein each of said coil-shaped electroconductive members includes an intermediate part fixedly secured in the corresponding through hole and a pair of projecting parts projecting, along said axis and at approximately a right angle to a plane defined by said base board, from respective sides of said base board, each projecting part having an outer diameter not less than the outer diameter of the intermediate part, and at least one of said axially projecting parts of said coil-shaped electroconductive members comprises a wire end spaced apart from an adjacent coil turn and which extends at a certain angle toward a major surface of said base board; and
- an interior surface of each of said through holes is plated with an electroconductive material, and coils of said intermediate part of each of said coil-shaped electroconductive members are configured to conduct high frequency electric current at reduced inductance by being soldered or brazed so as to contact each other and the corresponding electroconductive material in each through hole.

29. An electric contact unit according to claim 28, wherein said base board comprises said insulator.

30. An electronic contact unit according to claim 28, wherein said base board is an electroconductive metallic board, and said insulator comprises a tubular insulating member received in each of said through holes and configured to receive a corresponding one of said coil-shaped electroconductive members.

31. An electric contact unit according to claim 28, wherein at least one of said projecting parts of said coil-shaped electroconductive members comprises a wire end which is coiled around the axis and has an outer diameter that is somewhat greater than an associated inner diameter of the corresponding through hole.

32. An electric contact unit according to claim 28, further comprising means for mounting said base board on a circuit board at a prescribed spacing defined therebetween.

33. An electric contact unit according to claim 28, wherein said electric contact unit is adapted as a socket for mounting a semiconductor device on a circuit board.

34. An electric contact unit according to claim 28, wherein said electric contact unit is adapted as an electric connector for electrically connecting a pair of opposing groups of parts to be contacted.

35. An electric contact unit for conducting electric current between a pair of mutually opposing parts to be contacted, comprising:
- a base board having a plurality of through holes passed therethrough;
- a plurality of coil-shaped resilient and electroconductive members passed through corresponding ones of said through holes, wherein each coil-shaped member is wound around an axis unique to each member; and
- an insulator electrically insulating said coil-shaped electroconductive members from one another;
- wherein each of said coil-shaped electroconductive members includes an intermediate part fixedly secured in the corresponding through hole and a pair of projecting parts projecting along said axis and at approximately a right amgle to a plane defined by said base board, from respective sides of said base board, wherein each projecting part has an outer diameter not less than the outer diameter of the intermediate part, and wherein at least one of said projecting parts of said coil-shaped electroconductive members comprises a wire coil configured to conduct high frequency electric current at reduced inductance by including no more than approximately one coil turn, and having an outer diameter which is somewhat greater than an associated inner diameter of the corresponding through hole.

36. An electric contact unit according to claim 35, wherein said base board comprises said insulator.

37. An electric contact unit according to claim 35, wherein an interior surface of each of said through holes is plated with an electroconductive material, and coils of said intermediate part of each of said coil-shaped electroconductive members are configured to conduct high frequency electric current at reduced inductance by being soldered or brazed so as to contact each other and the corresponding electroconductive material in each through hole.

38. An electronic contact unit according to claim 35, wherein said base board is an electroconductive metallic board, and said insulator comprises a tubular insulating member received in each of said through holes and configured to receive a corresponding one of said coil-shaped electroconductive members.

39. An electric contact unit according to claim 35, wherein at least one of said projecting parts of said coil-shaped electroconductive members comprises a wire end which extends at a certain angle away from a major surface of said base board.

40. An electric contact unit according to claim 35, wherein at least one of said projecting parts of said coil-shaped electroconductive members comprises a wire end spaced apart from an adjacent coil turn and which extends at a certain angle toward a major surface of said base board.

41. An electric contact unit according to claim 35, wherein at least one of said projecting parts of said coil-shaped electroconductive members comprises a wire end which extends substantially in parallel with a major surface of said base board.

42. An electric contact unit according to claim 35, further comprising means for mounting said base board on a circuit board at a prescribed spacing defined therebetween.

43. An electric contact unit according to claim 35, wherein said electric contact unit is adapted as a socket for mounting a semiconductor device on a circuit board.

44. An electric contact unit according to claim 35, wherein said electric contact unit is adapted as an electric connector for electrically connecting a pair of opposing groups of parts to be contacted.

45. An electric contact unit comprising:
- a base board having a hole extending through the base board;
- an electrical insulator surrounding the hole; and
- a wire coil wound around an axis perpendicular to the base board;

wherein the coil has a first end portion, a second end portion opposite the first end portion, and an intermediate portion between the first and the second end portions;

wherein the intermediate portion is positioned and fixed within the hole such that the first and second end portions project from opposite sides of the base board; and wherein the wire coil is configured to conduct high frequency electric current at reduced inductance by the intermediate portion and the first and second end portions each including no more than approximately one coil turn.

46. An electric contact unit comprising:

a base board having a hole extending through the base board;

an electrical insulator surrounding the hole; and a wire coil wound around an axis perpendicular to the base board;

wherein the coil has a first end portion, a second end portion opposite the first end portion, and an intermediate portion between the first and the second end portions;

wherein the intermediate portion is positioned and fixed within the hole such that the first and second end portions project from opposite sides of the base board; and wherein the wire coil is configured to conduct high frequency electric current at reduced inductance by including no more than approximately one coil turn.

47. An electric contact unit comprising:

a base board having an orifice extending through the base board;

a through hole positioned in the orifice and having an electroconductive portion;

an electrical insulator surrounding the through hole; and a wire coil wound around the axis and having a first end portion, a second end portion opposite the first end portion, and an intermediate portion between the first and the second end portions;

wherein the intermediate portion is positioned and fixed within the through hole such that the first and second end portions project from opposite sides of the base board; and wherein the wire coil is configured to conduct high frequency electric current at reduced inductance by having coils of the intermediate portion soldered or brazed so as to electrically contact one another and the electroconductive portion of the through hole, and by having the first and second end portions each include no more than approximately one coil turn.

48. The unit of claim 47, wherein the first and second end portions together include no more than approximately one coil turn.

* * * * *